United States Patent
Chiang

(10) Patent No.: US 11,183,165 B2
(45) Date of Patent: Nov. 23, 2021

(54) ELECTRONIC DEVICE, ACTIVE NOISE REDUCTION SYSTEM, AND ACTIVE NOISE REDUCTION METHOD

(71) Applicant: Chiun Mai Communication Systems, Inc., New Taipei (TW)

(72) Inventor: Chien-Kuan Chiang, New Taipei (TW)

(73) Assignee: Chiun Mai Communication Systems, Inc., New Taipei (TW)

(*) Notice: Subject to any disclaimer, the term of this patent is extended or adjusted under 35 U.S.C. 154(b) by 0 days.

(21) Appl. No.: 17/127,411

(22) Filed: Dec. 18, 2020

(65) Prior Publication Data

US 2021/0193102 A1 Jun. 24, 2021

(30) Foreign Application Priority Data

Dec. 19, 2019 (CN) .......................... 201911315742.2

(51) Int. Cl.
*G10K 11/178* (2006.01)
*H05K 1/18* (2006.01)

(52) U.S. Cl.
CPC .......... *G10K 11/1785* (2018.01); *H05K 1/181* (2013.01); *G10K 2210/3016* (2013.01); *G10K 2210/3217* (2013.01); *G10K 2210/3226* (2013.01)

(58) Field of Classification Search
CPC ....... G10K 11/1785; G10K 2210/3016; G10K 2210/3217; G10K 2210/3226; H05K 1/181

See application file for complete search history.

(56) References Cited

U.S. PATENT DOCUMENTS

2014/0307889 A1* 10/2014 Hardell ................ G10K 11/178
   381/71.11
2019/0195826 A1* 6/2019 Yan ..................... G01N 27/4145

FOREIGN PATENT DOCUMENTS

| CN | 204578900 U | 8/2015 |
| CN | 107272482 A | 10/2017 |
| TW | M548819 U | 9/2017 |

OTHER PUBLICATIONS mlcc1.com May 10, 2016 "How to reduce MLCC piezoelectric effect and audible noise" www.mlcc1.com.

* cited by examiner

*Primary Examiner* — David L Ton
(74) *Attorney, Agent, or Firm* — ScienBiziP, P.C.

(57) ABSTRACT

An active noise reduction system includes a substrate, a number of capacitors mounted on the substrate, a noise sensor mounted on the substrate and used to collect a noise signal around the noise sensor, an actuator mounted on the substrate and used to generate vibrations, and a controller mounted on the substrate and electrically coupled to the noise sensor and the actuator. The controller is used to obtain the noise signal collected by the noise sensor and generate a control signal according to the noise signal to the actuator to control the actuator to generate vibrations having a same frequency and opposite phase as the noise signal to cancel out the vibrations generated by the plurality of capacitors and the vibrations of the substrate caused by the vibrations generated by the plurality of capacitors. An electronic device and an active noise reduction method are also provided.

14 Claims, 6 Drawing Sheets

ELECTRONIC DEVICE, ACTIVE NOISE REDUCTION SYSTEM, AND ACTIVE NOISE REDUCTION METHOD

FIELD

The subject matter herein generally relates to electronic devices, and more particularly to an active noise reduction system and an active noise reduction method implemented in the electronic device.

BACKGROUND

Generally, a plurality of capacitors is mounted on a circuit board of an electronic device to provide different functions for the electronic device. For example, providing functions, such as steading voltage, storing power, or the like. However, the capacitors may deform by the effect of piezoelectricity, and exert a force on the circuit board, causing the circuit board to vibrate, thereby amplifying a noise generated by the capacitors.

BRIEF DESCRIPTION OF THE DRAWINGS

Implementations of the present disclosure will now be described, by way of embodiments, with reference to the attached figures.

DETAILED DESCRIPTION

Figure 1:
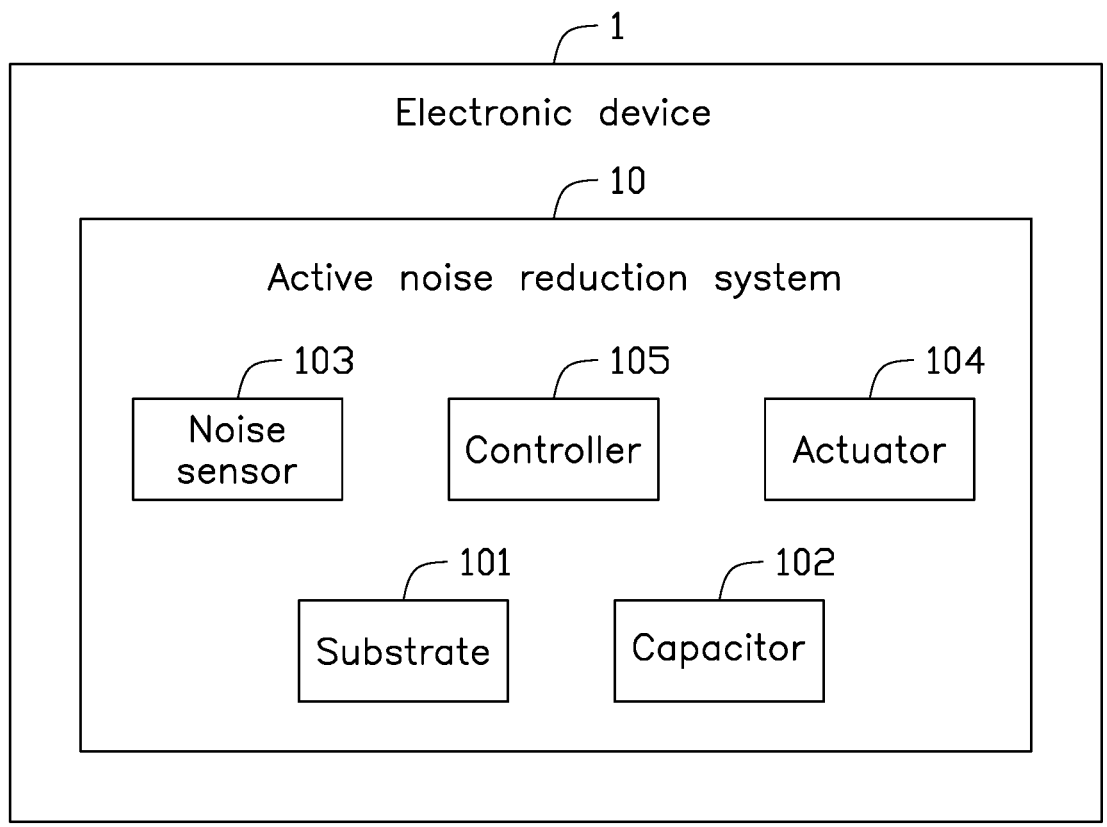
FIG. 1 is a schematic block diagram of an electronic device according to an embodiment of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

FIG. 1 is a schematic block diagram of an electronic device 1 provided by a first embodiment of the present disclosure. The electronic device may be a personal computer, a tablet computer, a smart phone, a personal digital assistant, or the like. The electronic device 1 includes an active noise reduction system 10. The active noise reduction system 10 is used to actively decrease noise generated by a capacitor in the electronic device 1 and a substrate on which the capacitor is mounted.

Figure 2:
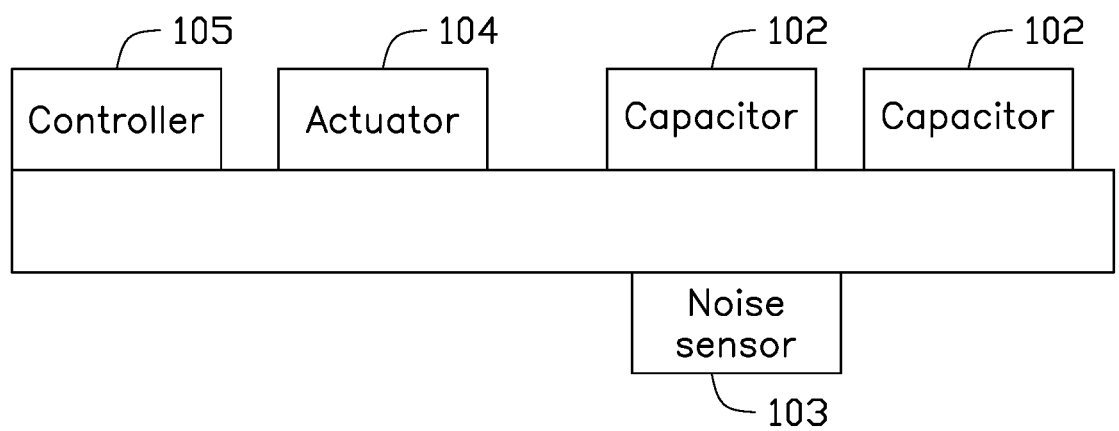
FIG. 2 is a schematic structural diagram of an active noise reduction system of the electronic device shown in FIG. 1.

Referring to FIGS. 1 and 2, the active noise reduction system 10 includes a substrate 101, a plurality of capacitors 102, a noise sensor 103, an actuator 104, and a controller 105. The substrate 101 is fixed in the electronic device 1. Conductive circuits are printed on or in the substrate 101.

The capacitors 102 are mounted on the substrate 101. In FIG. 2, only two capacitors 102 are shown, but the number of the capacitors 102 is not limited to two, and can be any suitable number. In one embodiment, each capacitor 102 is a ceramic capacitor. The capacitors 102 are mounted on the substrate 101 in the same or different arrangement. The capacitors 102 can be mounted on multiple surfaces of the substrate 101. The capacitors 102 can also be mounted on one surface of the substrate 101. Each capacitor 102 is used to provide various functions for the electronic device alone or together with other electronic components.

The noise sensor 103 is mounted on the substrate 101. In one embodiment, the noise sensor 103 is a digital microphone. The noise sensor 103 is used to collect a noise signal around the noise sensor 103.

The actuator 104 is mounted on the substrate 101. The actuator 104 is used to generate vibration. In one embodiment, the actuator 104 is a magnetic induction coil motor, a piezoelectric vibrator, or an audio coil vibrator. In one embodiment, the actuator 104 and the plurality of capacitors 102 are mounted on a same surface of the substrate 101. For example, the plurality of capacitors 102 are mounted on a first surface of the substrate 101, and the actuator 104 is also mounted on the first surface of the substrate 101. In one embodiment, the actuator 104 and the noise sensor 103 are mounted on opposite surfaces of the substrate 101.

The controller 105 is mounted on the substrate 101. The controller 105 is electrically coupled to the noise sensor 103 and the actuator 104. In one embodiment, the controller 105 is electrically coupled to the noise sensor 103 and the actuator 104 through conductive lines of the substrate 101. The controller 105 is used to obtain the noise signal collected by the noise sensor 103 and generate a control signal to the actuator 104 according to the noise signal to control the actuator 104 to generate vibrations having a same frequency and opposite phase as the noise signal to cancel out vibrations generated by the capacitors 102 and vibrations of the substrate 101 caused by the vibrations generated by the capacitors 102.

Therefore, in the first embodiment, the controller 105 controls the actuator 104 to generate vibrations having a same frequency and opposite phase as the noise signal to cancel out vibrations generated by the capacitors 102 and vibrations of the substrate 101 caused by the vibrations generated by the capacitors 102, the noise generated by vibrations generated by the capacitors 102 and vibrations of the substrate 101 caused by the vibrations generated by the capacitors 102 can be decreased. By using the noise sensor 103 and the actuator 104 to offset the vibration generated by the capacitors 102 and the substrate 101, each capacitor 102 does not need a separate noise sensor and actuator to decrease noise, which decreases cost. The actuator 104 and the plurality of capacitors 102 are located on one side of the substrate 101, so that the capacitors 102 and the actuator 104 can be arranged in any manner. The actuator 104 and the noise sensor 103 are mounted on opposite surfaces of the substrate 101, so that the noise signal collected by the noise sensor 103 is the noise generated by the capacitors 102 and the substrate 101.

Referring again to FIG. 1, FIG. 1 is a schematic block diagram of an electronic device 1 provided by a second embodiment of the present disclosure. The active noise reduction system of the second embodiment is similar to the active noise reduction system of the first embodiment, a detail difference will be described below.

The noise sensor 103 is used to collect a noise signal around the noise sensor 103 according to a predetermined period, and the controller 105 is used to determine whether a noise value of the noise signal is greater than or equal to a predetermined value. If the noise value of the noise signal is greater than or equal to the predetermined value, the controller 105 generates a control signal to the actuator 104 according to the noise signal to control the actuator 104 to generate vibrations having a same frequency and opposite phase as the noise signal to cancel out the vibrations generated by the capacitors 102 and the vibrations of the substrate 101 caused by the vibrations generated by the capacitors 102. If the noise value of the noise signal is less than the predetermined value, the controller 105 continues to obtain the noise signal collected by the noise sensor 103.

In the embodiment, if the noise value of the noise signal is greater than or equal to the predetermined value, the noise signal influences user lives, thus a noise reduction to the noise signal is needed. If the noise value of the noise signal is less than the predetermined value, the noise signal does not influence user lives, no need of a noise reduction to the noise signal.

Obviously, the second embodiment is not limited to the above embodiments, but also have other variations. For example, the noise sensor 103 still collects the noise signal around the noise sensor 103, and the controller 105 obtains the noise signal collected by noise sensor 103 at preset period. For example, if the noise value of the noise signal is less than the predetermined value, the controller 105 decreases a frequency of obtaining the noise signal collected by the noise sensor 103, thereby reducing cost of noise reduction.

In the second embodiment, the active noise reduction system 10 is not implemented if the noise value of the noise signal is less than the predetermined value, thereby avoiding reducing noise even the noise signal does not influence user lives, reducing cost of noise reduction.

Referring again to FIG. 1, FIG. 1 is a schematic block diagram of an electronic device 1 provided by a third embodiment of the present disclosure. The active noise reduction system of the third embodiment is similar to the active noise reduction system of the second embodiment, a detail difference will be described below.

The controller 105 is used to determine whether a frequency of the noise signal is within a predetermined frequency range. If the frequency of the noise signal is within the predetermined frequency range, the controller 105 determines that the noise signal is noise generated by the capacitors 102 and the substrate 101. At this time, the controller 105 determines whether the noise value of the noise signal is greater than or equal to the predetermined value. If the frequency of the noise signal is not within the predetermined frequency range, the controller 105 continues to obtain the noise signal collected by the noise sensor 103.

In one embodiment, if the frequency of the noise signal is within the predetermined frequency range, then the noise signal is noise caused by the vibrations of the capacitors 102 and the substrate 101. The active noise reduction system 10 of the disclosure can be implemented to reduce noise of the noise signal. If the frequency of the noise signal is not within the predetermined frequency range, then the noise signal is not noise caused by the vibrations of the capacitors 102 and the substrate 101, no need of the active noise reduction system 10 to reduce noise of the noise signal.

In the third embodiment, if the controller 105 determines that the frequency of the noise signal is within the predetermined frequency range and there is a noise signal that is greater than the predetermined value, then it is determined that the noise is not caused by the capacitors 102 and the substrate 101, and the active noise reduction system 10 is avoided implemented, thereby avoiding wasted cost and an increase in noise caused by the vibrations of the actuator 104.

Referring again to FIG. 1, FIG. 1 is a schematic block diagram of an electronic device 1 provided by a fourth embodiment of the present disclosure. The active noise reduction system of the fourth embodiment is similar to the active noise reduction system of the third embodiment, a detail difference will be described below.

After the controller 105 determines that the noise value of the noise signal is greater than or equal to the predetermined value, the controller 105 is further used to determine whether the noise value of the noise signal decreases. If the noise value of the noise signal decreases, the controller 105 continues to generate the control signal to the actuator 104 according to the noise signal to control the actuator 104 to generate vibrations having the same frequency and opposite phase as the noise signal to cancel out vibrations generated by the capacitors 102 and vibrations of the substrate 101 caused by the vibrations generated by the capacitors 102. If the noise value of the noise signal does not decrease, the controller 105 continues to obtain the noise signal collected by the noise sensor 103.

In one embodiment, whether the noise value of the noise signal is decreased is determined by comparing a currently obtained noise value of the noise signal collected by the noise sensor 103 with a previously obtained noise value of the noise signal collected by the noise sensor 103. If the noise value of the noise signal collected by the noise sensor 103 currently obtained is less than the noise value of the noise signal collected by the noise sensor 103 previously acquired, then it is determined that the noise value of the noise signal is decreased. If the currently acquired noise value of the noise signal collected by the noise sensor 103 is greater than or equal to the previously acquired noise value of the noise signal collected by the noise sensor 103, then it is determined that the noise value of the noise signal has not decreased.

If the noise value of the noise signal decreases, it means that the active noise reduction system 10 decreases the noise value of the noise signal. If the noise value of the noise signal does not decrease, it means that the noise signal is a previous noise signal, and the noise signal collected by the noise sensor 103 needs to be reacquired.

Obviously, the fourth embodiment is not limited to the above embodiments, but also have other variations. For example, if the noise value of the noise signal does not decrease, the controller 105 generates a prompt signal to prompt that the noise reduction is unsuccessful, so that a user is prompted that the noise reduction is unsuccessful.

In the fourth embodiment, the active noise reduction system 10 is used to decrease the noise value of the noise signal only when the noise value of the noise signal is decreased, so as to avoid wasting cost by implementing the active noise reduction system 10 if the noise reduction is unsuccessful.

Figure 3:
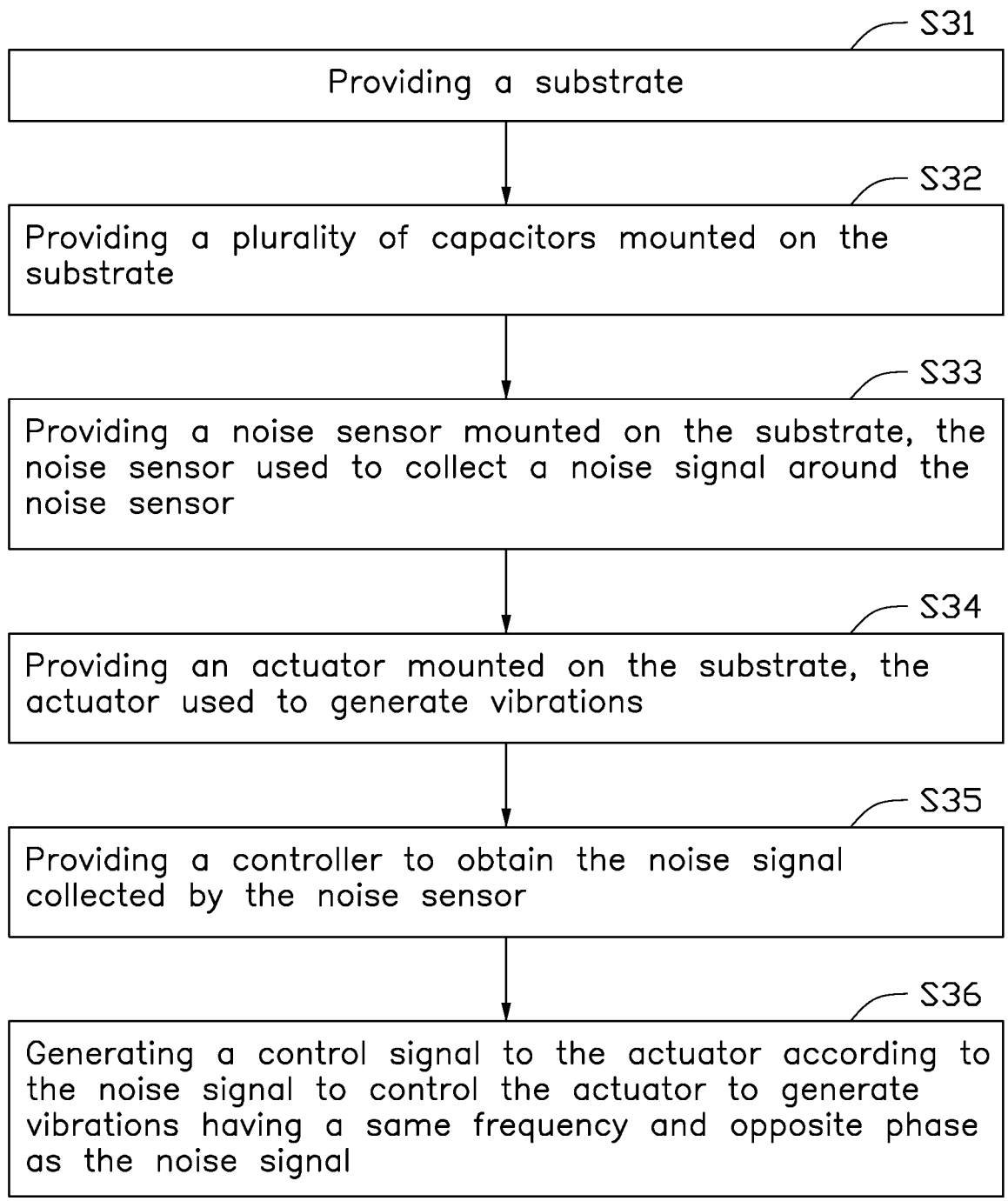
FIG. 3 is a flowchart of an active noise reduction method according to a first embodiment.

FIG. 3 shows a flowchart of an active noise reduction method according to a fifth embodiment. According to different needs, the order of blocks in the flowchart can be changed, and some blocks can be omitted or combined. The method is applied in an active noise reduction system of an electronic device. The active noise reduction system is applied in an electronic device. As shown in FIG. 3, the active noise reduction method can begin at block S31.

At block S31, a substrate is provided.

The substrate is fixed in the electronic device. Conductive circuits are printed on or in the substrate.

At block S32, a plurality of capacitors is provided, and the plurality of capacitors is mounted on the substrate.

In one embodiment, each capacitor is a ceramic capacitor. The capacitors are mounted on the substrate in a same or different arrangement. The capacitors can be mounted on multiple surfaces of the substrate. The multiple capacitors can also be all mounted on a same surface of the substrate. Each capacitor is used alone or together with other electronic components to provide various functions for the electronic device.

At block S33, a noise sensor is provided. The noise sensor is mounted on the substrate, and the noise sensor is used to collect noise signals around the noise sensor.

In one embodiment, the noise sensor is a digital microphone, or the like.

At block S34, an actuator is provided. The actuator is mounted on the substrate, and the actuator is used to generate vibrations.

In one embodiment, the actuator is a magnetic induction coil motor, a piezoelectric vibrator, or an audio coil vibrator. The actuator is used to generate vibrations. In one embodiment, the actuator and the capacitors are mounted on the same surface of the substrate, for example, the plurality of capacitors are mounted on a first surface of the substrate, and the actuator is also mounted on the first surface of the substrate. In one embodiment, the actuator and the noise sensor are mounted on opposite surfaces of the substrate.

At block S35, a controller is provided to obtain the noise signal collected by the noise sensor.

The controller is mounted on the substrate. The controller is electrically coupled to the noise sensor and the actuator. In one embodiment, the controller is electrically coupled to the noise sensor and the actuator through conductive lines of the substrate.

At block S36, the controller generates a control signal to the actuator according to the noise signal to control the actuator to generate vibrations having a same frequency and opposite phase as the noise signal to cancel out the vibrations generated by the capacitors and the vibrations of the substrate caused by the vibrations of the capacitors.

Therefore, in the fifth embodiment, the controller controls the actuator to generate vibrations having a same frequency and opposite phase as the noise signal to cancel out the vibrations generated by the capacitors and the vibrations of the substrate caused by the vibrations of the capacitors, the noise generated by vibrations generated by the capacitors and vibrations of the substrate caused by the vibrations generated by the capacitors can be decreased. By using the noise sensor and the actuator to offset the vibration generated by the capacitors and the substrate, each capacitor does not need a separate noise sensor and actuator to decrease noise, which decreases cost. The actuator and the plurality of capacitors are located on one side of the substrate, so that the capacitors and the actuator can be arranged in any manner. The actuator and the noise sensor are mounted on opposite surfaces of the substrate, so that the noise signal collected by the noise sensor is the noise generated by the capacitors and the substrate.

Figure 4:
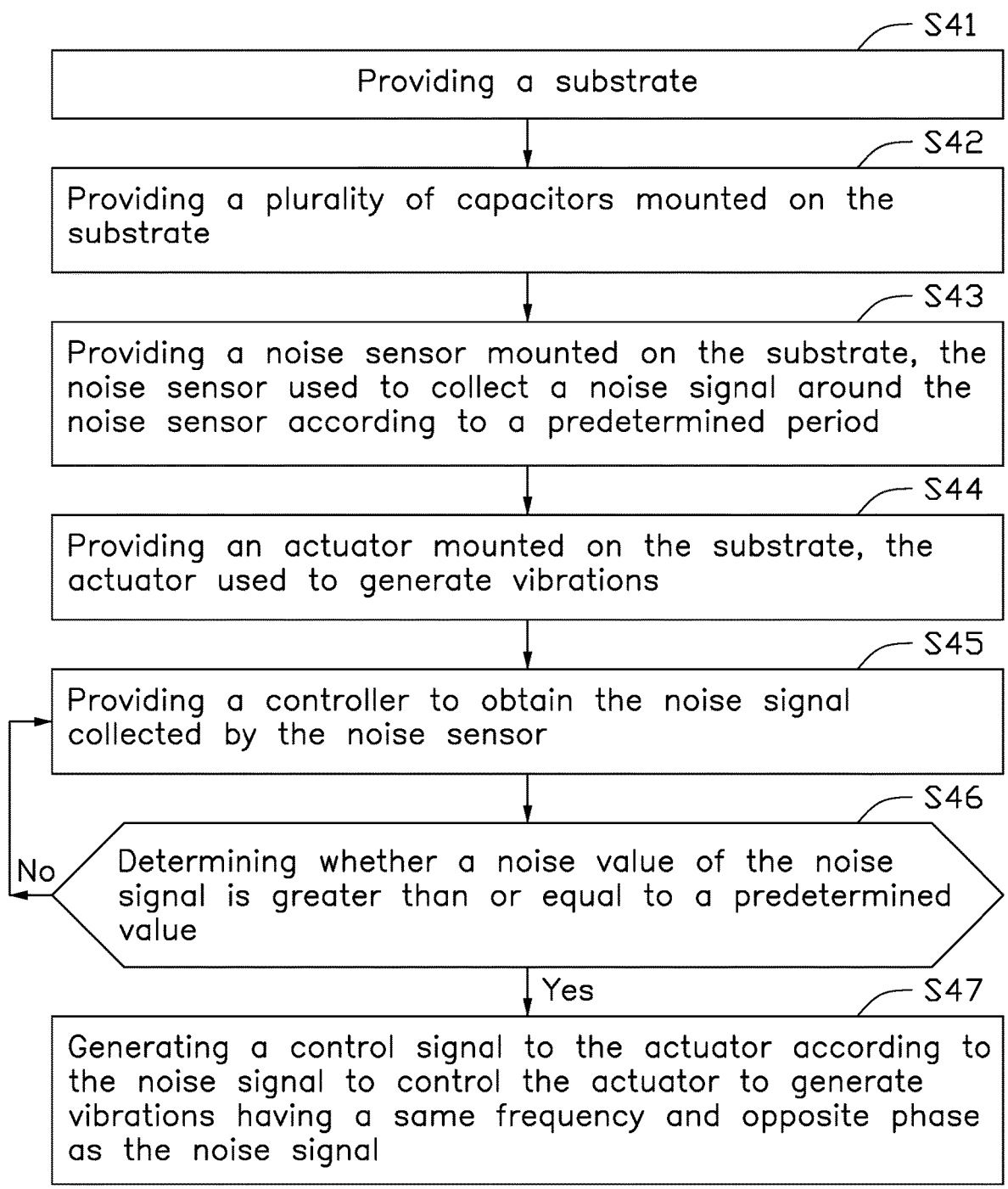
FIG. 4 is a flowchart of an active noise reduction method according to a second embodiment.

FIG. 4 shows a flowchart of an active noise reduction method of a sixth embodiment. According to different needs, the order of blocks in the flowchart can be changed, and some blocks can be omitted or combined. The method is applied in an active noise reduction system applied in an electronic device. The active noise reduction system is applied in an electronic device. As shown in FIG. 4, the active noise reduction method can begin at block S41.

At block S41, a substrate is provided.

The block S41 of the sixth embodiment is the same as the block S31 of the fifth embodiment, the detail can refer to the related description of the block S31 of the fifth embodiment, which will not be described herein.

At block S42, a plurality of capacitors is provided, and the capacitors are mounted on the substrate.

The block S42 of the sixth embodiment is the same as the block S32 of the fifth embodiment, the detail can refer to the related description of the block S32 of the fifth embodiment, which will not be described herein.

At block S43, a noise sensor is provided and mounted on the substrate. The noise sensor is used to collect noise signals around the noise sensor according to a predetermined period.

In one embodiment, the noise sensor is a digital microphone. The predetermined period may be a fixed period or an unfixed period.

At block S44, an actuator is provided. The actuator is mounted on the substrate and used to generate vibrations.

The block S44 of the sixth embodiment is the same as the block S34 of the fifth embodiment, the detail can refer to the related description of the block S34 of the fifth embodiment, which will not be described herein At block S45, a controller is provided to obtain the noise signal collected by the noise sensor.

The block S45 of the sixth embodiment is the same as the block S35 of the fifth embodiment, the detail can refer to the related description of the block S35 of the fifth embodiment, which will not be described herein At block S46, the controller determines whether a noise value of the noise signal is greater than or equal to a predetermined value, such as 20 decibels. If the noise value of the noise signal is greater than or equal to the predetermined value, block S47 is implemented. If the noise value of the noise signal is less than the predetermined value, block S45 is implemented.

In the embodiment, if the noise value of the noise signal is greater than or equal to the predetermined value, the noise signal influences user lives, thus a noise reduction to the noise signal is needed. If the noise value of the noise signal is less than the predetermined value, the noise signal does not influence user lives, no need of a noise reduction to the noise signal.

At block S47, the controller generates a control signal to the actuator according to the noise signal to control the actuator to generate vibrations having the same frequency and opposite phase as the noise signal to cancel out the vibrations generated by the capacitors and the vibrations of the substrate caused by the vibrations of the capacitors.

Obviously, the sixth embodiment is not limited to the above embodiments, but also have other variations. For example, the noise sensor still collects the noise signal around the noise sensor, and the controller obtains the noise signal collected by noise sensor at preset period. For example, if the noise value of the noise signal is less than the predetermined value, the controller decreases a frequency of obtaining the noise signal collected by the noise sensor, thereby reducing cost of noise reduction.

In the sixth embodiment, the active noise reduction system is not implemented if the noise value of the noise signal is less than the predetermined value, thereby avoiding reducing noise even the noise signal does not influence user lives, reducing cost of noise reduction.

Figure 5:
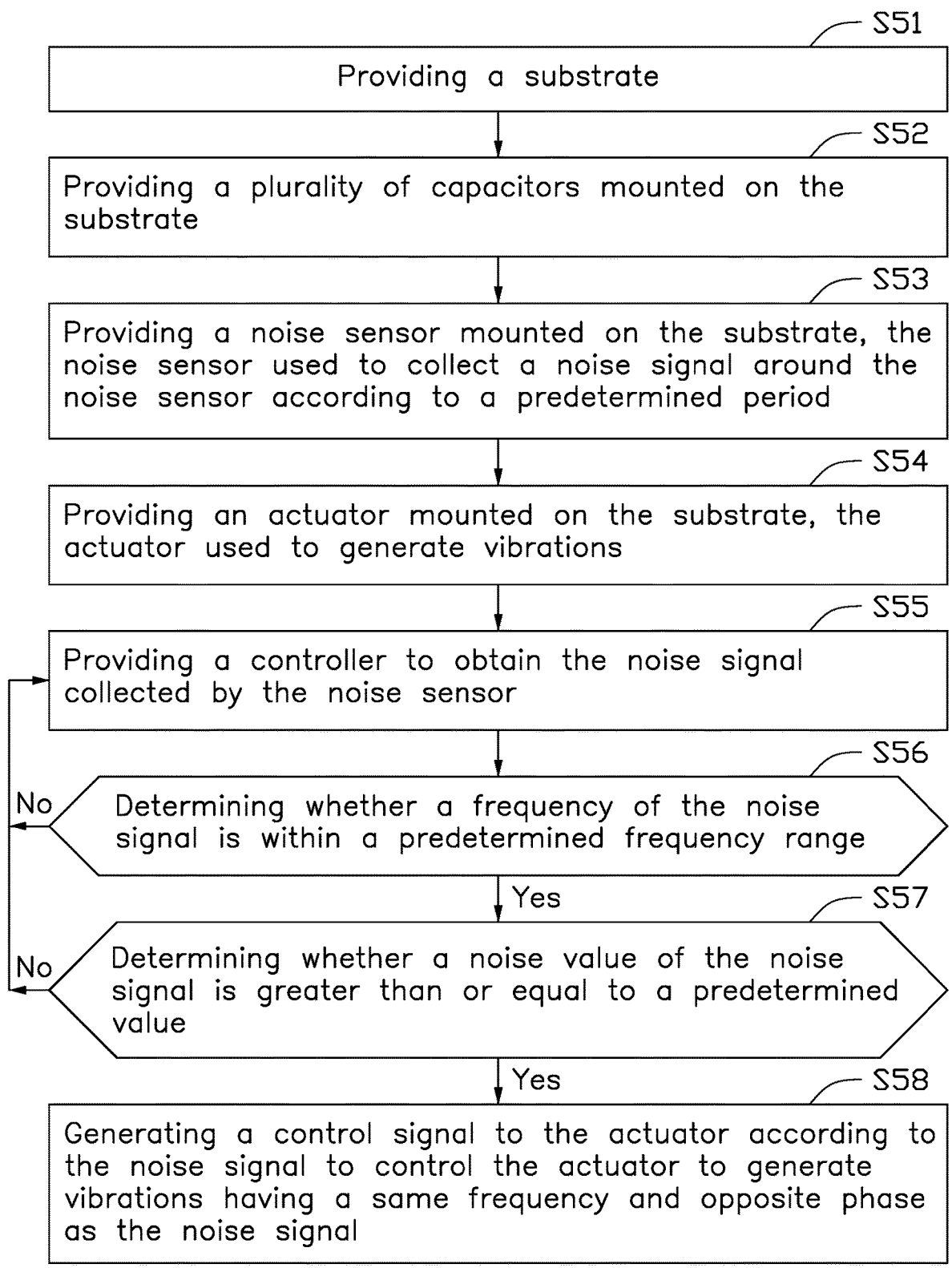
FIG. 5 is a flowchart of an active noise reduction method according to a third embodiment.

FIG. 5 shows a flowchart of an active noise reduction method of a seventh embodiment. According to different needs, the order of blocks in the flowchart can be changed, and some blocks can be omitted or combined. The method is applied in an active noise reduction system applied in an electronic device. The active noise reduction system is applied in an electronic device. As shown in FIG. 5, the active noise reduction method can begin at block S51.

At block S51, a substrate is provided.

The block S51 of the seventh embodiment is the same as the block S41 of the sixth embodiment, the details can refer to the related description of the block S41 of the sixth embodiment, which will not be described herein.

At block S52, a plurality of capacitors is provided, and the plurality of capacitors are mounted on the substrate.

The block S52 of the seventh embodiment is the same as the block S42 of the sixth embodiment, the details can refer to the related description of the block S42 of the sixth embodiment, which will not be described herein.

At block S53, a noise sensor is provided and mounted on the substrate. The noise sensor is used to collect a noise signal around the noise sensor according to a predetermined period.

The block S53 of the seventh embodiment is the same as the block S43 of the sixth embodiment, the details can refer to the related description of the block S43 of the sixth embodiment, which will not be described herein. At block S54, an actuator is provided and mounted on the substrate. The actuator is used to generate vibrations.

The block S54 is the same as the block S44, the details can refer to the related description of the block S44, which will not be described herein.

At block S55, a controller is provided to obtain the noise signal collected by the noise sensor.

The block S55 of the seventh embodiment is the same as the block S45 of the sixth embodiment, the details can refer to the related description of the block S45 of the sixth embodiment, which will not be described herein. At block S56, the controller determines whether a frequency of the noise signal is within a predetermined frequency range. If the frequency of the noise signal is within the predetermined frequency range, block S57 is implemented. If the frequency of the noise signal is not within the predetermined frequency range, block S55 is implemented.

In one embodiment, if the frequency of the noise signal is within the predetermined frequency range, it indicates that the noise signal is noise caused by the capacitors and the substrate, and the active noise reduction can be implemented. If the frequency of the noise signal is not within the predetermined frequency range, it indicates that the noise signal is not caused by the capacitors and the substrate, and so the active noise reduction cannot be implemented.

At block S57, the controller determines whether a noise value of the noise signal is greater than or equal to a predetermined value, such as 20 decibels. If the noise value of the noise signal is greater than or equal to the predetermined value, block S58 is implemented. If the noise value of the noise signal is less than the predetermined value, block S55 is implemented.

The block S57 of the seventh embodiment is the same as the block S46 of the sixth embodiment, the details can refer to the related description of the block S46 of the sixth embodiment, which will not be described herein.

At block S58, the controller generates a control signal to the actuator according to the noise signal to control the actuator to generate vibrations having a same frequency and opposite phase as the noise signal to cancel out the vibrations generated by the capacitors and the vibrations of the substrate caused by the vibrations of the capacitors.

In the seventh embodiment, if the frequency of the noise signal is within the predetermined frequency range and there is a noise signal that is greater than the predetermined value, then it is determined that the noise is not caused by the capacitors and the substrate, and the active noise reduction system is avoided implemented, thereby avoiding wasted cost and an increase in noise caused by the vibrations of the actuator.

Figure 6:
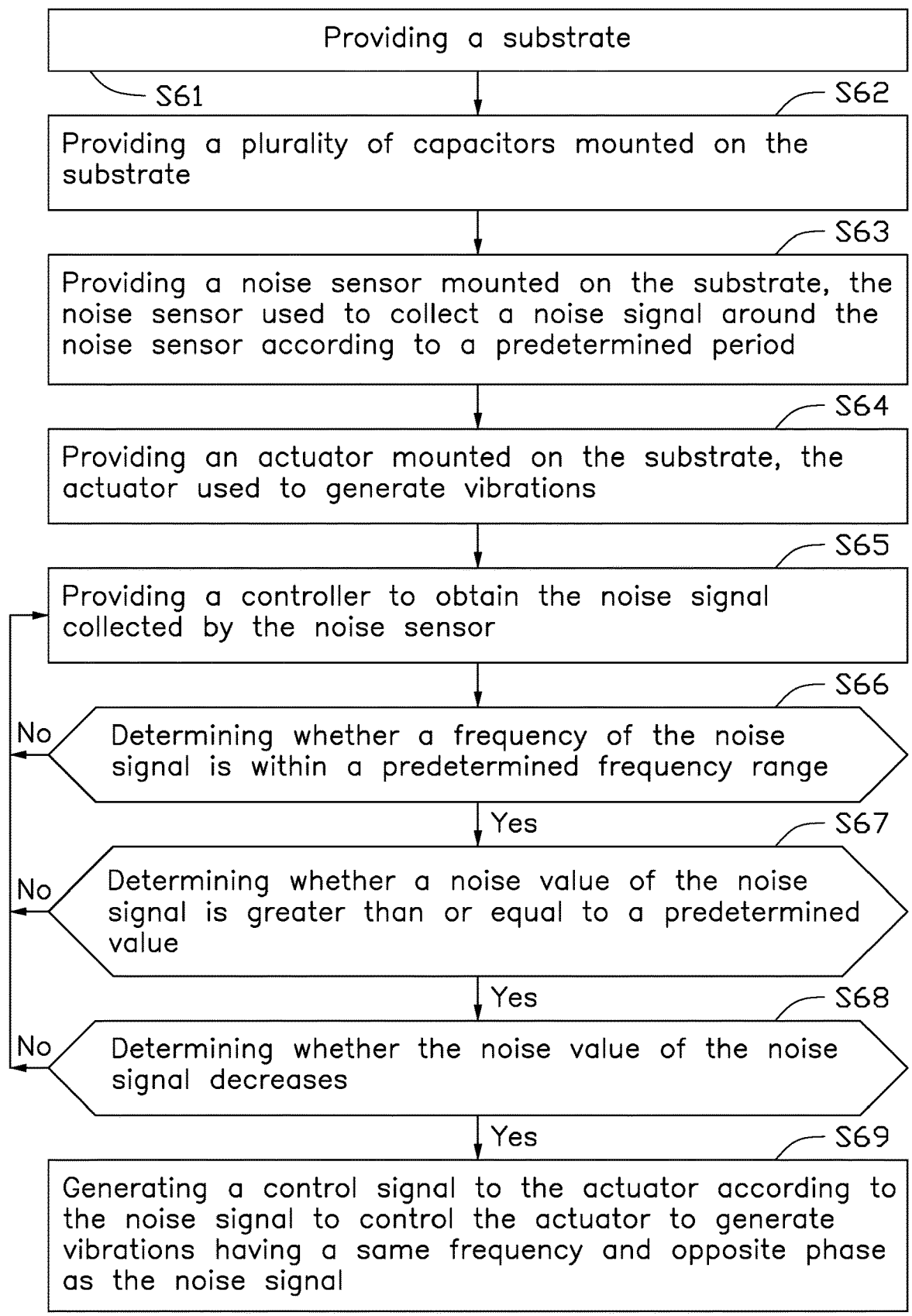
FIG. 6 is a flowchart of an active noise reduction method according to a fourth embodiment.

FIG. 6 shows a flowchart of an active noise reduction method of an eighth embodiment. According to different needs, the order of blocks in the flowchart can be changed, and some blocks can be omitted or combined. The method is applied in an active noise reduction system applied in an electronic device. As shown in FIG. 6, the active noise reduction method can begin at block S61.

At block S61, a substrate is provided.

The block S61 of the eight embodiment is the same as the block S51 of the seventh embodiment, the details can refer to the related description of the block S51 of the seventh embodiment, which will not be described herein.

At block S62, a plurality of capacitors is provided, and the capacitors are mounted on the substrate.

The block 62 of the eighth embodiment is the same as the block 52 of the seventh embodiment, the details can refer to the related description of the block 52 of the seventh embodiment, which will not be described herein.

At block S63, a noise sensor is provided and mounted on the substrate. The noise sensor is used to collect a noise signal around the noise sensor according to a predetermined period.

The block S63 of the eighth embodiment is the same as the block S53 of the seventh embodiment, the details can refer to the related description of the block S53 of the seventh embodiment, which will not be described herein.

At block S64, an actuator is provided and mounted on the substrate. The actuator is used to generate vibrations.

The block S64 of the eighth embodiment is the same as the block S54 of the seventh embodiment, the details can refer to the related description of the block S54 of the seventh embodiment, which will not be described herein.

At block S65, a controller is provided to obtain the noise signal collected by the noise sensor.

The block S65 of the eighth embodiment is the same as the block S55 of the seventh embodiment, the details can refer to the related description of the block S55 of the seventh embodiment, which will not be described herein.

At block S66, the controller determines whether a frequency of the noise signal is within a predetermined frequency range. If the frequency of the noise signal is within the predetermined frequency range, block S67 is implemented. If the frequency of the noise signal is not within the predetermined frequency range, block S65 is implemented.

In one embodiment, if the frequency of the noise signal is within the predetermined frequency range, it indicates that the noise signal is noise caused by the capacitors and the substrate, and the active noise reduction can be implemented. If the frequency of the noise signal is not within the predetermined frequency range, it indicates that the noise signal is not caused by the capacitors and the substrate, and so the active noise reduction cannot be implemented.

At block S67, the controller determines whether the noise value of the noise signal is greater than or equal to a predetermined value, such as 20 decibels. If the noise value of the noise signal is greater than or equal to the predetermined value, block S68 is implemented. If the noise value of the noise signal is less than the predetermined value, block S65 is implemented.

The block S67 of the eighth embodiment is the same as the block S57 of the seventh embodiment, the details can refer to the related description of the block S57 of the seventh embodiment, which will not be described herein.

At block S68, the controller determines whether the noise value of the noise signal decreases. If the noise value of the noise signal decreases, block S69 is implemented. If the noise value of the noise signal does not decrease, block S65 is implemented.

In one embodiment, whether the noise value of the noise signal is decreased is determined by comparing a currently obtained noise value of the noise signal collected by the noise sensor with a previously obtained noise value of the noise signal collected by the noise sensor. If the noise value of the noise signal collected by the noise sensor currently obtained is less than the noise value of the noise signal collected by the noise sensor previously acquired, then it is determined that the noise value of the noise signal is decreased. If the currently acquired noise value of the noise signal collected by the noise sensor is greater than or equal to the previously acquired noise value of the noise signal collected by the noise sensor, then it is determined that the noise value of the noise signal has not decreased.

If the noise value of the noise signal decreases, it means that the active noise reduction decreases the noise value of the noise signal. If the noise value of the noise signal does not decrease, it means that the noise signal is a previous noise signal, and the noise signal collected by the noise sensor needs to be reacquired.

At block S69, the controller generates a control signal to the actuator according to the noise signal to control the actuator to generate vibrations having a same frequency and opposite phase as the noise signal to cancel out the vibrations generated by the capacitors and the vibrations of the substrate caused by the vibrations of the capacitors.

Obviously, the eighth embodiment is not limited to the above embodiments, but also have other variations. For example, if the noise value of the noise signal does not decrease, the controller generates a prompt signal to prompt that the noise reduction is unsuccessful, so that a user is prompted that the noise reduction is unsuccessful.

In the eighth embodiment, the active noise reduction method is used to decrease the noise value of the noise signal only when the noise value of the noise signal is decreased, so as to avoid wasting cost by implementing the active noise reduction method if the noise reduction is unsuccessful.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An active noise reduction system comprising:
a substrate;
a plurality of capacitors mounted on the substrate;
a noise sensor mounted on the substrate and used to collect a noise signal around the noise sensor;
an actuator mounted on the substrate and used to generate vibrations;
a controller mounted on the substrate and electrically coupled to the noise sensor and the actuator, the controller used to obtain the noise signal collected by the noise sensor and generate a control signal according to the noise signal to the actuator to control the actuator to generate vibrations having a same frequency and opposite phase as the noise signal to cancel out the vibrations generated by the plurality of capacitors and the vibrations of the substrate caused by the vibrations generated by the plurality of capacitors.

2. The active noise reduction system of claim 1, wherein:
the actuator and the plurality of capacitors are mounted on a same surface of the substrate.

3. The active noise reduction system of claim 1, wherein:
the noise sensor is used to collect the noise signal around the noise sensor according to a predetermined period;
the controller is used to determine whether a noise value of the noise signal is greater than or equal to a predetermined value;
the controller is used to generate a control signal to the actuator according to the noise signal to control the actuator to generate vibrations having a same frequency and opposite phase as the noise signal if the noise value of the noise signal is greater than or equal to the predetermined value to cancel out the vibrations generated by the plurality of capacitors and the vibrations of the substrate caused by the vibrations generated by the plurality of capacitors.

4. The active noise reduction system of claim 3, wherein:
the controller is further used to determine whether a frequency of the noise signal is within a predetermined frequency range;
the controller is used to determine whether the noise value of the noise signal is greater than or equal to the predetermined value if the frequency of the noise signal is within the predetermined frequency range.

5. The active noise reduction system of claim 3, wherein:
the controller is further used to determine whether the noise value of the noise signal decreases;
the controller is used to continue to generate a control signal to the actuator according to the noise signal to control the actuator to generate vibrations having a same frequency and opposite phase as the noise signal if the noise value of the noise signal decreases to cancel out the vibrations generated by the plurality of capacitors and the vibrations of the substrate caused by the vibrations generated by the plurality of capacitors.

6. An electronic device comprising an active noise reduction system, the active noise reduction system comprising:
a substrate;
a plurality of capacitors mounted on the substrate;
a noise sensor mounted on the substrate and used to collect a noise signal around the noise sensor;
an actuator mounted on the substrate and used to generate vibrations;
a controller mounted on the substrate and electrically coupled to the noise sensor and the actuator, the controller used to obtain the noise signal collected by the noise sensor and generate a control signal according to the noise signal to the actuator to control the actuator to generate vibrations having a same frequency and opposite phase as the noise signal to cancel out the vibrations generated by the plurality of capacitors and the vibrations of the substrate caused by the vibrations generated by the plurality of capacitors.

7. The electronic device of claim 6, wherein:
the actuator and the plurality of capacitors are mounted on a same surface of the substrate.

8. The electronic device of claim 6, wherein:
the noise sensor is used to collect the noise signal around the noise sensor according to a predetermined period;
the controller is used to determine whether a noise value of the noise signal is greater than or equal to a predetermined value;
the controller is used to generate a control signal to the actuator according to the noise signal to control the actuator to generate vibrations having a same frequency and opposite phase as the noise signal if the noise value of the noise signal is greater than or equal to the predetermined value to cancel out the vibrations generated by the plurality of capacitors and the vibrations of the substrate caused by the vibrations generated by the plurality of capacitors.

9. The electronic device of claim 8, wherein:
the controller is further used to determine whether a frequency of the noise signal is within a predetermined frequency range;
the controller is used to determine whether the noise value of the noise signal is greater than or equal to the predetermined value if the frequency of the noise signal is within the predetermined frequency range.

10. The electronic device of claim 8, wherein:
the controller is further used to determine whether the noise value of the noise signal decreases;
the controller is used to continue to generate a control signal to the actuator according to the noise signal to control the actuator to generate vibrations having a same frequency and opposite phase as the noise signal if the noise value of the noise signal decreases to cancel out the vibrations generated by the plurality of capacitors and the vibrations of the substrate caused by the vibrations generated by the plurality of capacitors.

11. An active noise reduction method comprising:
providing a substrate;
providing a plurality of capacitors mounted on the substrate;
providing a noise sensor mounted on the substrate, the noise sensor used to collect a noise signal around the noise sensor;
providing an actuator mounted on the substrate, the plurality of capacitors mounted on a same surface of the substrate, and the actuator used to generate vibrations;
obtaining the noise signal collected by the noise sensor;
generating a control signal according to the noise signal to the actuator to control the actuator to generate vibrations having a same frequency and opposite phase as the noise signal to cancel out the vibrations generated by the plurality of capacitors and the vibrations of the substrate caused by the vibrations generated by the plurality of capacitors.

12. The active noise reduction method of claim 11, further comprising:
collecting the noise signal around the noise sensor according to a predetermined period;
determining whether a noise value of the noise signal is greater than or equal to a predetermined value;
generating a control signal to the actuator according to the noise signal to control the actuator to generate vibrations having a same frequency and opposite phase as the noise signal if the noise value of the noise signal is greater than or equal to the predetermined value to cancel out the vibrations generated by the plurality of capacitors and the vibrations of the substrate caused by the vibrations generated by the plurality of capacitors.

13. The active noise reduction method of claim 12, further comprising:
determining whether a frequency of the noise signal is within a predetermined frequency range;
determining whether the noise value of the noise signal is greater than or equal to the predetermined value if the frequency of the noise signal is within the predetermined frequency range.

14. The active noise reduction method of claim 12, further comprising:
determining whether the noise value of the noise signal decreases;
continuing to generate a control signal to the actuator according to the noise signal to control the actuator to generate vibrations having the same frequency and opposite phase as the noise signal if the noise value of the noise signal decreases to cancel out the vibrations generated by the plurality of capacitors and the vibrations of the substrate caused by the vibrations generated by the plurality of capacitors.

* * * * *